United States Patent
Ni et al.

(10) Patent No.: US 6,465,159 B1
(45) Date of Patent: Oct. 15, 2002

(54) METHOD AND APPARATUS FOR SIDE WALL PASSIVATION FOR ORGANIC ETCH

(75) Inventors: Tuqiang Ni, Fremont; Nancy Tran, San Jose, both of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/340,743

(22) Filed: Jun. 28, 1999

(51) Int. Cl.[7] .............................. G03F 7/36; B44C 1/22; H01L 21/311
(52) U.S. Cl. ........................ 430/314; 430/311; 430/313; 430/317; 216/37; 216/67; 438/695; 438/710; 438/725
(58) Field of Search .............................. 430/311, 313, 430/314, 317; 216/37, 67; 438/695, 710, 725

(56) References Cited

U.S. PATENT DOCUMENTS

| | | | | |
|---|---|---|---|---|
| 4,744,639 A | * | 5/1988 | Tsuboyama | 350/350 |
| 5,087,959 A | | 2/1992 | Omori et al. | 357/54 |
| 5,356,515 A | | 10/1994 | Tahara et al. | 156/643 |
| 5,447,598 A | * | 9/1995 | Mihara | 216/46 |
| 5,674,355 A | | 10/1997 | Cohen et al. | 156/652.1 |
| 5,679,269 A | | 10/1997 | Cohen et al. | 216/72 |
| 6,040,248 A | * | 3/2000 | Chen | 438/725 |
| 6,114,250 A | * | 9/2000 | Ellingboe | 438/709 |
| 6,127,273 A | * | 10/2000 | Laermer | 438/709 |
| 2001/0001741 A1 | * | 5/2001 | Akahori et al. | 438/706 |

FOREIGN PATENT DOCUMENTS

| | | | |
|---|---|---|---|
| EP | 407 169 | * | 1/1991 |
| FR | 2 673 763 | * | 9/1992 |
| JP | 10-144676 | * | 5/1998 |

* cited by examiner

Primary Examiner—Mark F. Huff
Assistant Examiner—Nicole Barreca
(74) Attorney, Agent, or Firm—Martine & Penilla, LLP

(57) ABSTRACT

A robust method for etching an organic low-k insulating layer on a semiconductor device, as disclosed herein, includes introducing into a processing chamber a substrate with an organic insulating layer and an overlying mask layer having an aperture. A plasma is then developed within the chamber from an oxidizing gas and a passivation gas. The passivation gas is preferably either a silicon containing gas or a boron containing gas, or both. The ratio of the oxidizing gas to the passivation gas is preferably at least 10:1. In addition, an inert carrier gas may be provided. The plasma is then used to etch the organic insulating layer through the mask layer, thereby forming a via having essentially vertical sidewalls in the organic low-k insulating layer.

6 Claims, 4 Drawing Sheets

METHOD AND APPARATUS FOR SIDE WALL PASSIVATION FOR ORGANIC ETCH

BACKGROUND OF THE INVENTION

The present invention relates generally to semiconductor processing and, more particularly to methods for etching organic insulating layers.

The present day semiconductor industry continually strives to increase device performance by reducing device dimensions and increasing device packing densities. For a given chip size, increasing the device packing density can be achieved by reducing the vertical and lateral distance separating active devices, with a resulting reduction in dielectric thickness (often referred to as inter-metal oxide or IMO) between layers. Unfortunately, reducing dielectric thickness increases interlayer capacitance, which results in diminished high frequency performance of the integrated circuit.

In integrated circuits, conventional insulating layers, such as silicon dioxide and silicon nitride, generally have dielectric constants "k" of about 3.9 and above. For example, the dielectric constant of silicon dioxide is about 3.9 and the dielectric constant of silicon nitride is about 9.0. As the feature scales shrink in IC devices it becomes desirable to reduce the dielectric constant of the insulating layer to reduce the inter-layer capacitance.

Since the dielectric constant "k" of some organic materials, such as FLARE from AlliedSignal, Inc. and SiLK from Dow Chemical, is generally less than 2.7, organic materials can be used as a low-k organic insulating layers for chip fabrication. However, the organic materials present problems during a conventional etch process. Most notably, etching organic materials using conventional methods results in the organic insulating layer having via sidewalls that are undercut and bowed.

FIG. 1A is an illustration showing a cross-sectional view of a prior art integrated circuit structure 10 having an organic insulating layer 12 prior to a plasma etch. More particularly, integrated circuit structure 10 includes an organic insulating layer 12, a silicon dioxide hardmask layer 14 disposed above the organic insulating layer 12, and an organic resist mask 16 formed above the silicon dioxide hardmask layer 14. FIG. 1B shows the integrated circuit structure 10 after etching the silicon dioxide hardmask layer 14 by a suitable oxide-etch process though the resist mask 16. FIG. 1C shows the integrated circuit structure 10 after etching ("oxidizing") the organic insulating layer 12 using conventional oxygen containing gases. A conventional etch of organic low-k materials in a plasma chamber typically employs oxygen containing gases such as $O_2$, $CO_2$, and $SO_2$. In the presence of plasma, oxygen atoms and ions are formed. Atomic oxygen reacts with organic material and forms CO, $H_2$, and $CO_2$ as by products. However, spontaneous reactions between the atomic oxygen and the organic low-k materials occur. The reactions between the atomic oxygen and the organic low-k insulating layer cause isotropic etching, which results in undercut and bowing of the organic insulating layer 12 as illustrated by the bowed profile of sidewalls 18.

To counter undercut and bowing in the sidewalls 18, gases such as $C_2H_4$ are sometimes used during organic etch. FIG. 1D shows the integrated circuit structure after etching the organic insulating layer 12 using $C_2H_4$ containing gases. The $C_2H_4$ forms a $C_xH_y$ polymer on the etch sidewall during the etch process. The result is a sidewall 18 which is sometimes less undercut and bowed than the sidewall profile resulting from conventional oxygen containing gases. However, this approach is difficult to control, and does not always result in an improved sidewall 18 profile. The amount of improvement depends on the parameters used to control the sidewall 18 profile, resulting in an approach which is delicate and lacking robustness.

Another approach used to counter undercut and bowing in the sidewall 18 profile during an organic etch is the use of high energy sputtering. Prior art FIG. 1E shows the integrated circuit structure 10 after etching the organic insulating layer 12 using high energy sputtering. The high energy sputtering causes sputtering of $SiO_2$ from the silicon dioxide hardmask layer 14 to create sidewall passivation. However, the high energy sputtering can cause damage 20 to the hardmask layer 14 during the etch process. In addition, when a deep etch is needed, high energy sputtering is often insufficient to cause sidewall passivation coating near the bottom of the via, again resulting in an undercut and bowed sidewall 18 profile.

All of the organic etch approaches discussed above fail to provide a consistent, robust etch process which provides a sidewall profile in an organic insulating layer that is not undercut or bowed. Accordingly, there exist a need for a robust organic etch process that does not cause damage to the IC, and provides better sidewall profiles.

SUMMARY OF THE INVENTION

The present invention meets the aforementioned requirements by providing a process that etches organic insulating layers utilizing an oxidizing gas and a passivation gas. The passivation gas reacts with oxygen atoms or oxygen molecules to form a nonvolatile passivation film which deposits on the sidewalls of vias being formed in the organic insulating layer. The passivation film provides sidewall passivation which essentially inhibits isotropic etch of the organic insulating layer. Thus, the resultant via sidewall profile in the organic insulating layer is essentially vertical with respect to the plane of the insulating layer.

One aspect of the present invention teaches a method for anisotropically etching an organic insulating layer through an aperture in a mask layer. A substrate, with an organic insulating layer and an overlying mask layer having an aperture, is introduced into a processing chamber. A plasma is then developed within the chamber from an oxidizing gas and a passivation gas. The passivation gas is preferably either a silicon containing gas or a boron containing gas, or both. The ratio of the oxidizing gas to the passivation gas is preferably at least 10:1. An inert carrier gas may also be provided. The plasma is then used to etch the organic insulating layer through the mask layer.

Another aspect of the present invention teaches an etch system for organic layers. The organic etch system includes a chamber which is receptive to a substrate provided with an organic insulating layer to be etched. Also included is a gas inlet mechanism connecting an oxidizing gas and a passivation gas source. The passivation gas is derived from the group including silicon containing gases and boron containing gases. The ratio of the oxidizing gas to the passivation gas is preferably at least 10:1. Further included in the system is a pair of electrodes disposed within the chamber, and an RF generator coupled to the electrode pair so that a plasma is formed with the oxidizing gas and the passivation gas which etches exposed portions of the organic insulating layer.

As stated above, the present invention has the ability to produce accurate vias having essentially vertical sidewall profiles in organic insulating layers. The ability to produce accurate vias allows the use of organic low-k insulating layers in integrated circuit fabrication. The organic low-k insulating layers lower the interlayer capacitance, and thereby increase high frequency performance of the integrated circuit.

These and other advantages of the present invention will become apparent to those skilled in the art upon a reading of the following descriptions and a study of the various figures of the drawings.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1A:
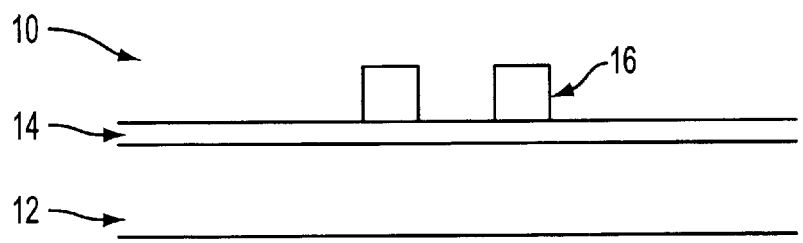
FIG. 1A is an illustration showing a cross-sectional view of a prior art integrated circuit structure prior to a plasma etch.
Figure 1B:
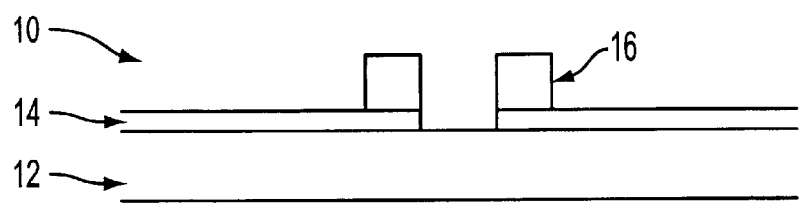
FIG. 1B is an illustration showing a cross-sectional view of the prior art integrated circuit structure after etching the silicon dioxide layer.
Figure 1C:
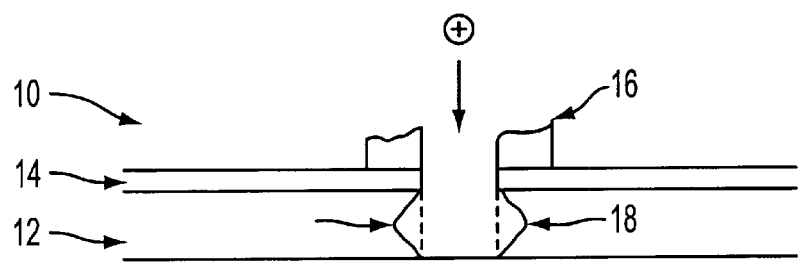
FIG. 1C is an illustration showing a cross-sectional view of the prior art integrated circuit structure after etching the organic insulating layer using conventional oxygen containing gases.
Figure 1D:
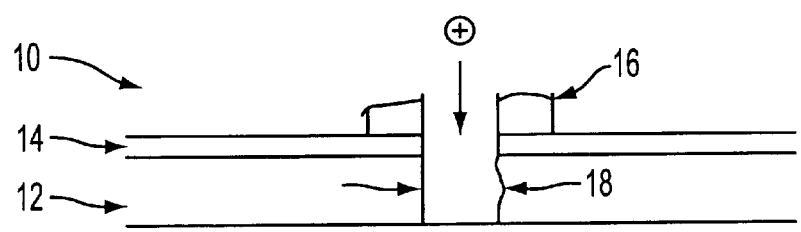
FIG. 1D is an illustration showing a cross-sectional view of the prior art integrated circuit structure after etching the organic insulating layer using $C_2H_4$ containing gases.
Figure 1E:
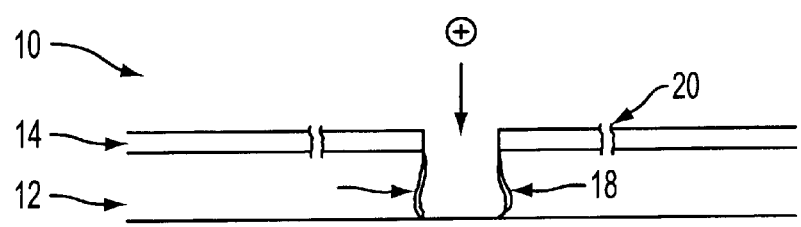
FIG. 1E is an illustration showing a cross-sectional view of the prior art integrated circuit structure after etching the organic insulating layer using high energy sputtering.
Figure 2A:
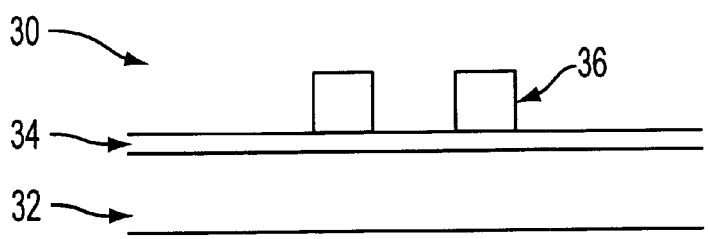
FIG. 2A is an illustration showing a cross-sectional view of an integrated circuit structure prior to a plasma etch in accordance with a preferred embodiment of the present invention.

FIGS. 1A–1E were described in terms of the prior art. A preferred embodiment of the present invention will now be described with reference to FIGS. 2A–2C. FIG. 2A is an illustration showing an integrated circuit structure 30 prior to plasma etch in accordance with a preferred embodiment of the present invention. The integrated circuit 30 includes an organic low-k insulating layer 32, a silicon dioxide layer 34 disposed above the organic low-k insulating layer 32, and an organic resist mask 36 formed above the silicon dioxide layer 34.

Figure 2B:
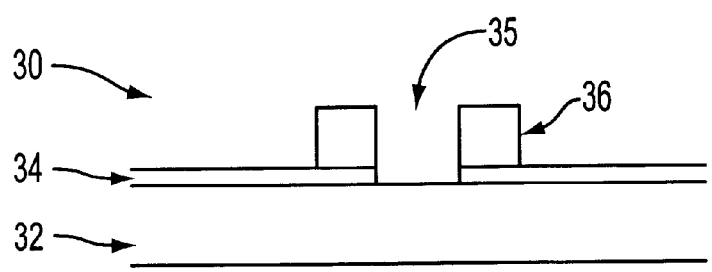
FIG. 2B is an illustration showing a cross-sectional view of an integrated circuit structure after etching the silicon dioxide layer in accordance with a preferred embodiment of the present invention.

A process in accordance with the present invention begins with an etch of the silicon dioxide layer 34 preferably utilizing a gas such as $CF_4$. Other gases such as $C_2F_6$, $CHF_3$, and $SF_6$ are also suitable for use in the etching process. Process parameters for etching silicon dioxide are well known to those skilled in the art. The result of the etch is shown in FIG. 2B.

Figure 2C:
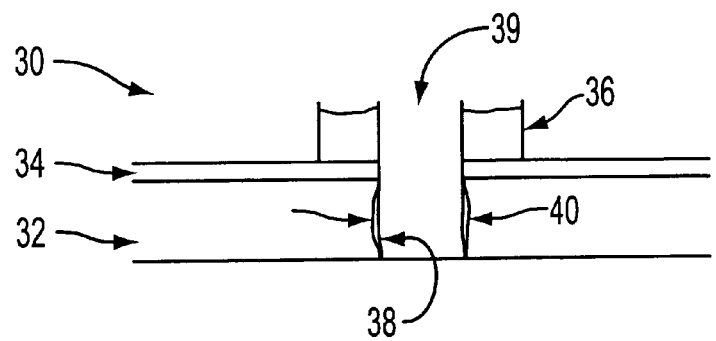
FIG. 2C is an illustration showing a cross-sectional view of an integrated circuit structure after etching the organic insulating layer using a silicon containing passivation gas in accordance with a preferred embodiment of the present invention.

After etching the silicon dioxide layer 34, a mixture of a passivation gas and an oxidizing gas are formed into a plasma to anisotropically etch the organic insulating layer 32 through an aperture 35 in the silicon dioxide layer 34. FIG. 2C is an illustration showing the integrated circuit structure 30 after etching the organic low-k insulating layer 32 using a passivation gas added to an oxygen containing plasma. The passivation gas can be either a silicon containing gas, such as $SiH_4$, $SiF_4$, or $SiCl_4$, or a boron containing gas, such as $BCl_3$.

More particularly, plasma including a passivation gas and an oxidizing gas is used to etch vias in the organic low-k insulating layer 32. The passivation gas reacts with oxygen atoms or oxygen molecules to form a nonvolatile passivation film 38 during this process. The type of passivation film 38 is determined by the type of passivation gas utilized, for example, silicon containing gases result in an $SiO_2$ passivation film, while boron containing gases result in a $B_2O_2$ passivation film. The passivation film 38 deposits on the sidewalls of the vias 39 as they form in the organic low-k insulating layer 32. Normally, spontaneous reactions between atomic oxygen from the plasma and the organic insulating layer cause isotropic etching, which results in undercut and bowing in the sidewall 40 profile. However, the sidewall passivation film 38 of the present invention provides sidewall passivation which essentially inhibits isotropic etch resulting from spontaneous reactions between atomic oxygen and the organic insulating layer. Thus, the sidewall 40 profile of the present invention is essentially vertical with respect to the plane of the insulating layer.

Figure 3:
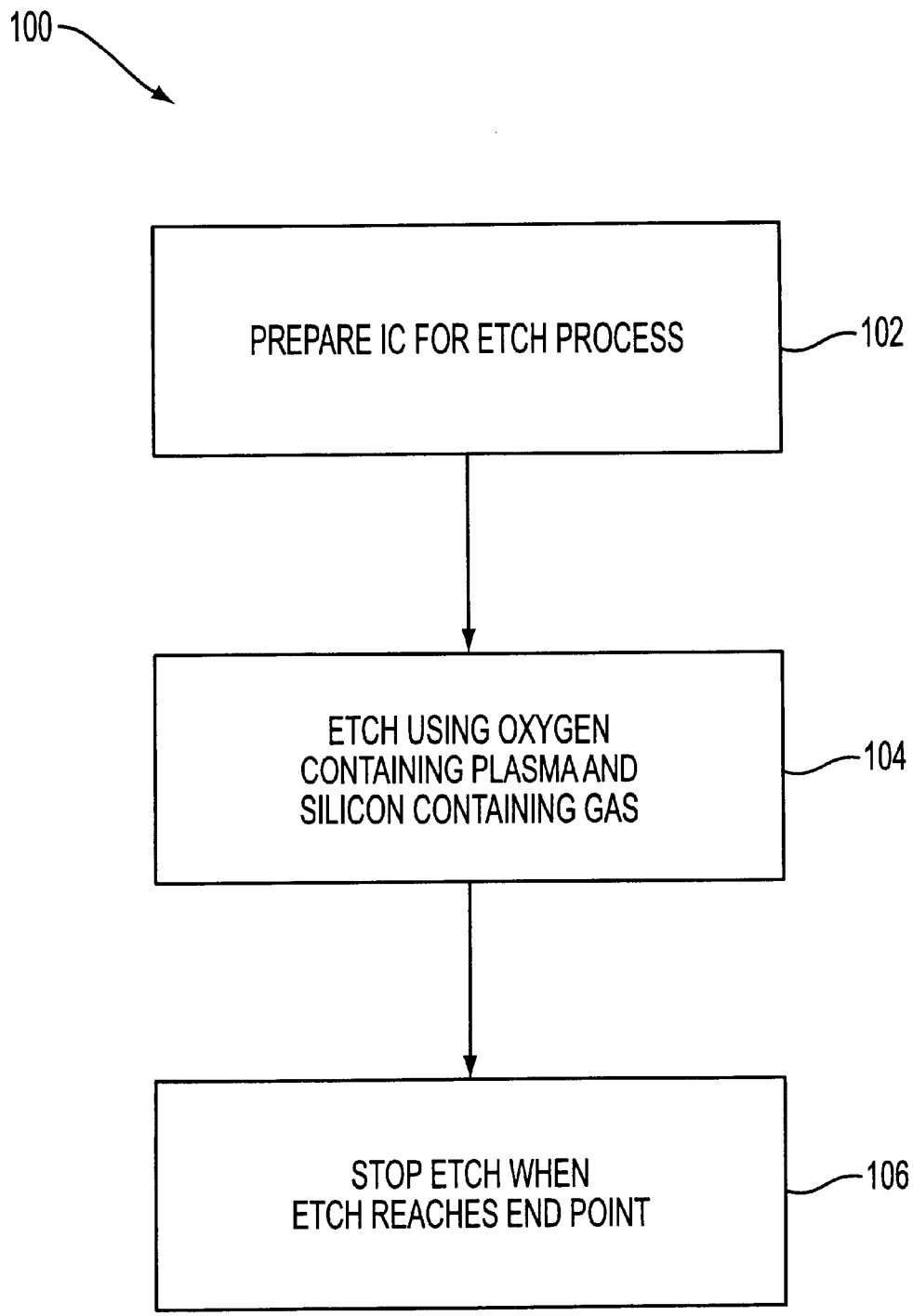
FIG. 3 is a flow chart showing a method for etching an organic insulating layer in accordance with one embodiment of the present invention.

Referring next to FIG. 3, a method 100 for etching an organic low-k insulating layer in accordance with one embodiment of the present invention will now be described. In an initial operation 102, an integrated circuit is prepared for the organic insulating layer etch process. Typically, this preparation includes etching the silicon dioxide layer with a fluorocarbon-containing gas such as $CF_4$, $C_2F_6$, $CHF_3$, and/or $SF_6$. As will be apparent to those skilled in the art, fluorine from the fluorocarbon-containing gas reacts with the silicon in the silicon dioxide layer during the etch process. The actual process parameters for etching silicon dioxide are also well know to those skilled in the art. Having etched the silicon dioxide layer, the integrated circuit structure is then ready for the organic insulating layer etch.

The method 100 continues with an organic insulating layer etch, in an operation 104. After etching the silicon dioxide layer, a mixture of a passivation gas and an oxidizing gas are formed into a plasma to anisotropically etch the organic insulating layer through an aperture in the silicon dioxide layer. The passivation gas can be either a silicon containing gas, such as $SiH_4$, $SiF_4$, or $SiCl_4$, or a boron containing gas, such as $BCl_3$. In addition, the oxygen to passivation gas ratio in the plasma preferably does not exceed 10:1. However, during an organic insulating layer etch having a longer etch time, the oxygen to passivation gas ratio is typically about 100:1, in order to avoid over passivation of the via sidewalls. Over passivation of via sidewalls may cause etch stop and sloped via sidewalls from passivation film buildup, and therefore should be avoided. On the other hand, during a highly active organic insulating layer etch having a shorter etch time, the oxygen to passivation gas ratio is typically about than 50:1, in order to avoid under passivation of the via sidewalls.

Using these ratios of oxygen containing gas to silicon containing gas, the organic etch rate is in the range of about 0.4–2.0 $\mu$/min, resulting in an organic layer etch time of between 1–2 minutes.

To elaborate further, the plasma, including the passivation gas and the oxidizing gas, is used to etch vias in the organic low-k insulating layer. The passivation gas reacts with oxygen atoms or oxygen molecules to form a nonvolatile passivation film. The type of passivation film formed is determined by the type of passivation gas utilized in the plasma. For example, silicon containing gases result in an $SiO_2$ passivation film, while boron containing gases result in a $B_2O_2$ passivation film. The passivation film deposits on the sidewalls of the vias as they form in the organic insulating layer. Normally, spontaneous reactions between atomic oxygen from the plasma and the organic insulating layer cause isotropic etching which results in undercut and bowing in the sidewall profile. However, the sidewall passivation film of the present invention provides sidewall passivation which essentially inhibits isotropic etch resulting from spontaneous reactions between atomic oxygen and the organic low-k insulating layer. Thus, the sidewall profile of the present invention is essentially vertical with respect to the plane of the insulating layer.

Finally, in an operation 106, the organic low-k insulating layer etch process is stopped when the etch reaches an end point. Dry etch equipment used in a typical semiconductor production environment requires the availability of effective diagnostic and etch end point detection tools. Four common methods for determining the end point of dry etch processes are: laser reflectivity; optical emission spectroscopy; direct observation of the etched surface through a viewing port on the chamber, by a human operator; and mass spectroscopy.

Figure 4:
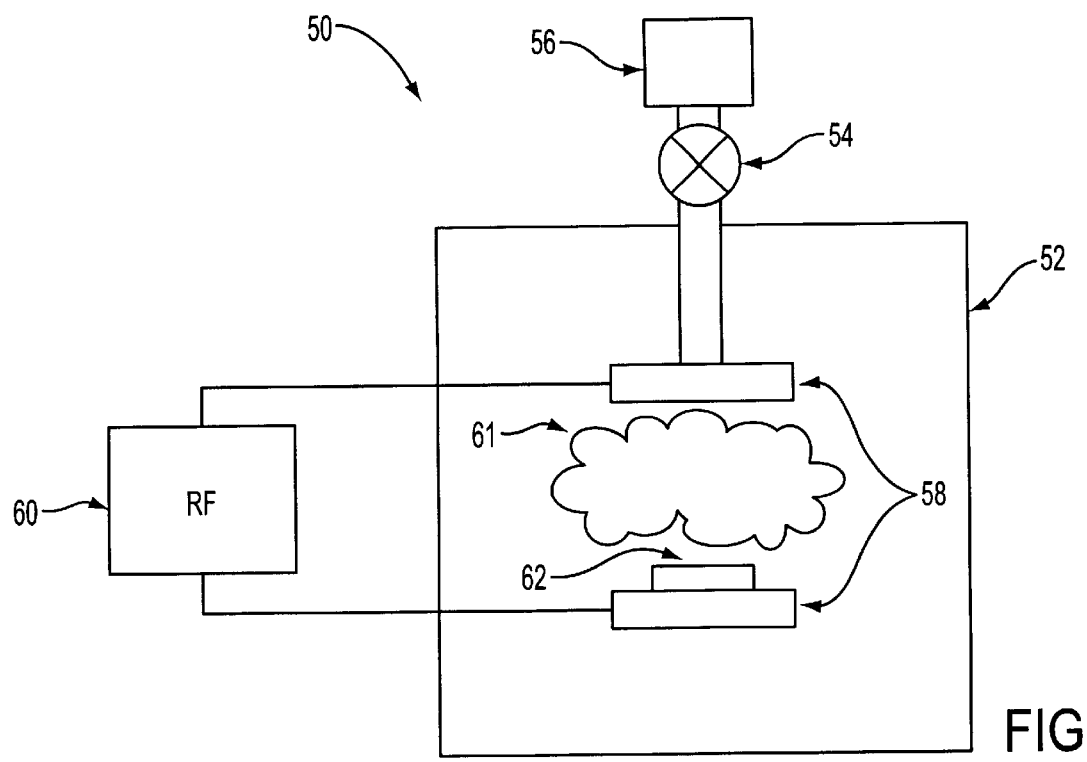
FIG. 4 is an illustration showing an organic insulating layer etching system in accordance with one embodiment of the present invention.

Plasma etching systems as described above consist of several components. FIG. 4 is an illustration showing an organic insulating layer etching system 50 in accordance with one embodiment of the present invention. The organic insulating layer etching system 50 includes a chamber 52 receptive to a substrate 62 provided with an organic insulating layer to be etched, a gas inlet mechanism 54 connecting to an oxidizing gas and a passivation gas source 56, a pair of electrodes 58 disposed within the chamber 50, and an RF generator 60 coupled to the electrodes 58. In some instances the upper electrode can by omitted by grounding the RF generator 60 to the chamber 52.

After the substrate 62 is prepared for the organic low-k insulating layer etch, it is placed in the chamber 52. The gas inlet mechanism 54 is then used to release, into the chamber 52, the oxidizing gas and the passivation gas from the gas source 56. The RF generator 60 is then used to create a plasma 61 containing the oxidizing and passivation gases in the chamber 52. The passivation gas reacts with oxygen atoms, molecules, or ions to form a nonvolatile passivation film on via sidewalls. The type of passivation film formed is determined by the type of passivation gas utilized. For example, silicon containing gases result in a $SiO_2$ passivation film, while boron containing gases result in a $B_2O_2$ passivation film. The passivation film deposits on the via sidewalls formed in the organic insulating layer of the substrate 62. Normally, spontaneous reactions between atomic oxygen from the plasma and the organic low-k insulating layer cause isotropic etching which results in undercut and bowing in the sidewall profile. However, the sidewall passivation film of the present invention provides sidewall passivation which essentially inhibits isotropic etch resulting from spontaneous reactions between atomic oxygen and the organic insulating layer. Thus, the sidewall profile of the present invention is essentially vertical with respect to the plane of the organic insulating layer.

Figure 5:
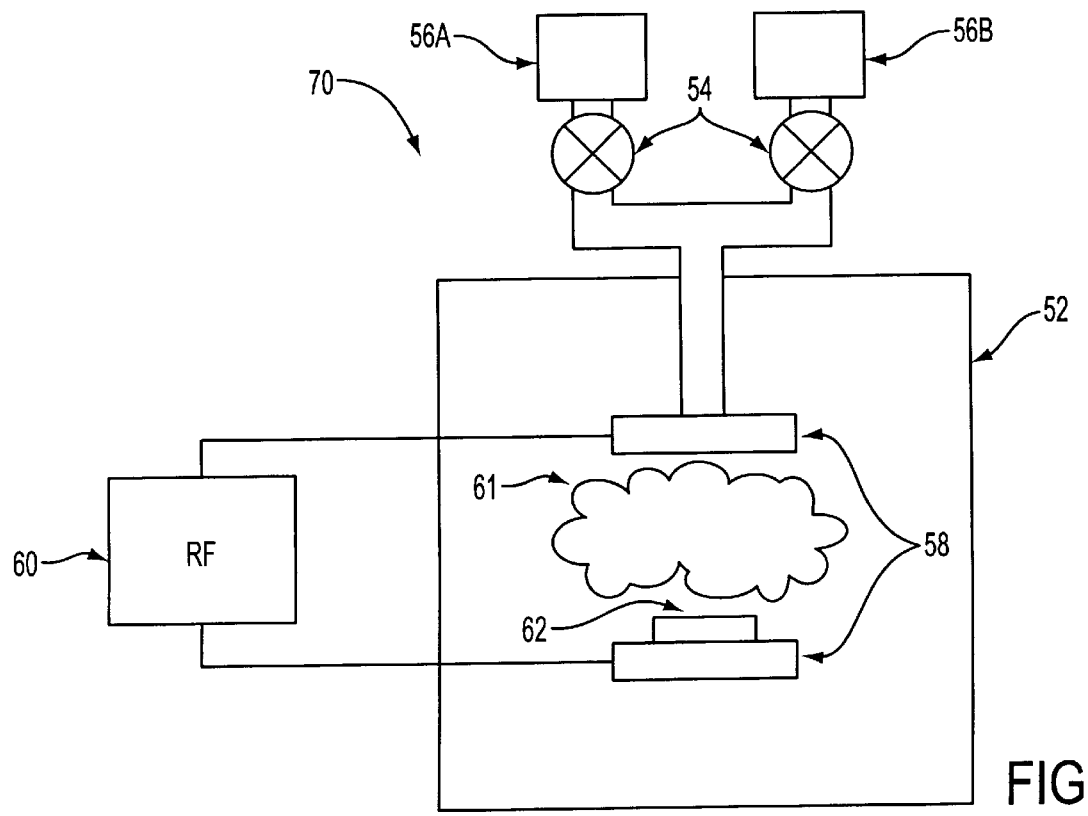
FIG. 5 is an illustration showing an organic insulating layer etching system having multiple gas inlets in accordance with one embodiment of the present invention.

In another embodiment of the present invention, the oxidizing and passivation gases are kept separate until released into the plasma containing chamber 52. FIG. 5 is an illustration showing an organic insulating layer etching system 70 having multiple gas inlets in accordance with one embodiment of the present invention. The organic insulating layer etching system 70 includes a chamber 52 receptive to a substrate 62 provided with an organic low-k insulating layer to be etched, multiple gas inlet mechanisms 54 connecting to an oxidizing gas source 56A and a passivation gas source 56B, a pair of electrodes 58 disposed within the chamber 50, and an RF generator 60 coupled to the electrodes 58. As described above, in some cases the upper electrode can be omitted by grounding the RF generator 60 to the chamber 52.

Some passivation gases, such as $SiF_4$ and $SiCl_4$ can be premixed with the oxidizing gas before being released into the plasma containing chamber 52. In such cases, the organic insulating layer etching system only requires a single gas inlet 54 and gas source 56, as shown in FIG. 4. However, some passivation gases, such as $SiH_4$, cannot be premixed with the oxidizing gas before being released in the plasma containing chamber 52, because such passivation gases will react with the oxygen before being released into the plasma. In these cases, multiple gas inlets 54 and gas sources 56A, 56B are needed. One gas source 56A contains the oxidizing gas, while the other gas source 56B contains the passivation gas. The gas inlet mechanisms 54 are then used to release the oxidizing gas and the passivation gas into the plasma containing chamber 52 in the proper ratio, usually under automated (e.g., computer) control. The oxygen to passivation gas ratio in the plasma preferably does not exceed 10:1. However, during an organic insulating layer etch having a longer etch time, the oxygen to passivation gas ratio is typically about than 100:1, in order to avoid over passivation of the via sidewalls. On the other hand, during a highly active organic insulating layer etch having a shorter etch time, the oxygen to passivation gas ratio is typically about than 50:1, in order to avoid under passivation of the via sidewalls. Using these ratios of oxygen containing gas to silicon containing gas, the organic etch rate is in the range of about 0.4–2.0 $\mu$/min, resulting in an organic layer etch time of between 1–2 minutes.

While this invention has been described in terms of several preferred embodiments, there are many alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for anisotropically etching an organic insulating layer through an aperture in a mask layer, comprising:

introducing a substrate provided with an organic low-k insulating layer and an overlying mask layer having an aperture into a processing chamber; and creating a plasma within said chamber having components derived from an oxidizing gas and a passivation gas, wherein the passivation gas is derived from boron containing gasses, wherein the ratio of said oxidizing gas to said passivation gas is at least 50:1, whereby said organic insulating layer is etched through said aperture in said mask layer.

2. A method as recited in claim 1, wherein the ratio of said oxidizing gas to said passivation gas in at least 100:1.

3. A method as recited in claim 1, wherein the passivation gas is $BCl_3$.

4. A method as recited in claim 1, wherein the overlying mask includes a plurality of apertures.

5. A method for making an integrated circuit structure having an organic dielectric layer provided with a via having essentially vertical sidewalls, comprising:

introducing a substrate provided with an organic insulating layer and an overlying mask layer having an aperture into a processing chamber; and creating a plasma within said chamber having components derived from an oxidizing gas and a passivation gas, said passivation gas derived from boron containing gasses, wherein the ratio of said oxidizing gas to said passivation gas is at least 50:1, whereby said organic insulating layer is etched through said aperture in said mask layer.

6. A method as recited in claim 5, wherein the ratio of said oxidizing gas to said passivation gas in at least 100:1.

\* \* \* \* \*